(12) United States Patent
Yoshioka et al.

(10) Patent No.: US 7,713,368 B2
(45) Date of Patent: May 11, 2010

(54) SHEET PEELING APPARATUS AND PEELING METHOD

(75) Inventors: Takahisa Yoshioka, Tokyo (JP); Yoshiaki Sugishita, Tokyo (JP)

(73) Assignee: Lintec Corporation, Tokyo (JP)

( * ) Notice: Subject to any disclaimer, the term of this patent is extended or adjusted under 35 U.S.C. 154(b) by 468 days.

(21) Appl. No.: 11/779,046

(22) Filed: Jul. 17, 2007

(65) Prior Publication Data

US 2008/0017311 A1    Jan. 24, 2008

(30) Foreign Application Priority Data

Jul. 20, 2006    (JP)    ............................ 2006-197759

(51) Int. Cl.
    *B32B 38/10*    (2006.01)
(52) U.S. Cl. .................... 156/247; 156/344; 156/584
(58) Field of Classification Search ................ 156/247, 156/344, 584; 438/464, 976
    See application file for complete search history.

(56) References Cited

U.S. PATENT DOCUMENTS

| | | | |
|---|---|---|---|
| 2005/0205204 A1* | 9/2005 | Kurosawa et al. | 156/344 |
| 2006/0060055 A1* | 3/2006 | Wardell et al. | 83/703 |
| 2006/0219359 A1* | 10/2006 | Miyamoto et al. | 156/344 |
| 2007/0235131 A1* | 10/2007 | Tsujimoto et al. | 156/344 |

FOREIGN PATENT DOCUMENTS

| | | |
|---|---|---|
| JP | 2003-022986 | 1/2003 |
| JP | 2004-273527 | 9/2004 |

* cited by examiner

*Primary Examiner*—Mark A Osele
(74) *Attorney, Agent, or Firm*—Lowe Hauptman Ham & Berner

(57) ABSTRACT

A sheet S is stuck on the front surface of a wafer W, and the wafer W is supported on a table 20. A peeling tape T is stuck onto a peripheral portion of the sheet S and the peeling tape T is held by a peeling head 13. The peeling head 13 and the table 20 perform a relative movement along guide rails 25, the table 20 rotates a predetermined angle in clockwise and counterclockwise directions alternately via a swing mechanism 21 thereby peeling off the sheet S from the wafer W accompanying a zigzag movement.

8 Claims, 8 Drawing Sheets

SHEET PEELING APPARATUS AND PEELING METHOD

RELATED APPLICATIONS

The present application is based on, and claims priority from, Japanese Application Number 2006-197759, filed Jul. 20, 2006, the disclosure of which is hereby incorporated by reference herein in its entirety.

BACKGROUND OF THE INVENTION

1. Field of the Invention

The present invention relates to a sheet peeling apparatus and a peeling method, in particular, to a sheet peeling apparatus and a peeling method capable of, when peeling off a protective sheet or the like stuck on an adherend such as a semiconductor wafer, performing the peeling while controlling to reduce a peeling force.

2. Related Art

Conventionally, a semiconductor wafer (hereinafter, simply referred to as "wafer") is stuck with a protective sheet for protecting a circuit surface thereof. The protective sheet is peeled off via a sheet peeling apparatus, for example, after a back grinding processing is carried out on the wafer.

As a sheet peeling method mentioned above, there is known, for example, a method using a sheet peeling apparatus disclosed in a patent document 1. The apparatus is arranged to stick a peeling tape to a protective sheet and wind the peeling tape with a roller thereby peeling off the sheet.

[Patent document 1] Japanese Patent Application Laid-Open No. 2004-273527

SUMMARY OF THE INVENTION

However, in the sheet peeling method using the peeling apparatus disclosed in the patent document 1, as the peeling of the protective sheet progresses, larger force is required to peel off the protective sheet from the wafer. To be more precisely, when peeling off the protective sheet stuck on the wafer, first of all, the peeling tape is stuck onto a peripheral portion of the protective sheet. Then, the protective sheet is turned over to peel off the same toward an opposite side in the radial direction of the wafer from the peripheral portion of the protective sheet. Here, since the wafer ordinarily has a circular or similar plane shape, although an initial peeling width (a contact width between an adherend and an adhesive sheet) is small, the peeling width becomes larger toward a central area of the wafer. As a result, as the peeling progresses, the force required for peeling off also becomes larger causing a peeling failure such that the peeling tape stuck on the protective sheet is slipped off; the peeling tape is broken; or the protective sheet itself is torn off.

The present invention has been proposed in view of the foregoing disadvantages. It is an object of the present invention to provide a sheet peeling apparatus and a peeling method capable of peeling off the sheet while reducing a peeling force as small as possible so as to reduce the peeling failure.

In order to achieve the above object, the present invention is a sheet peeling apparatus, which comprises:

a support means that supports an adherend stuck with a sheet on a surface thereof;

a peeling head that sticks a peeling tape onto the sheet to peel off the sheet; and a moving means that causes the support means and peeling head to perform a relative movement thereby peeling off the sheet, wherein at least one of the support means and peeling head is provided with a swing mechanism, and when the support means and the peeling head perform the relative movement, a zigzag movement accompanies therewith via the swing mechanism.

In the present invention, the support means includes a table having a loading plane for the adherend and a base for supporting the table, the swing mechanism is provided between the table and the base, and the table is arranged so as to turn alternately with respect to the base within a plane via the swing mechanism.

Also, the peeling head may be attached to a free-end side of a multi-articulated robot having a plurality of joints, and the robot functions as the swing mechanism and is arranged so as to be capable of swinging alternately with respect to the support means within a plane.

Further, there is included a peeling assisting means accessible to the upper surface side of the sheet, wherein the peeling assisting means includes a swing plate having an edge that is, when peeling off the sheet, brought into contact with a folding edge of the sheet.

Furthermore, the peeling assisting means may include a swing roller having a rolling member that, when peeling off the sheet, enters a folded portion of the sheet.

Still further, such an arrangement is preferably employed that the peeling assisting means is swingable within a plane so as to follow the zigzag movement.

Further, the present invention employs a sheet peeling method, which comprises the steps of:

sticking a peeling tape via a peeling head to a peripheral area of a sheet stuck on a front surface of an adherend; and in a state that the peeling tape is held, peeling off the sheet toward a side opposite to a position where the peeling tape is stuck thereto, wherein when the adherend and peeling head are caused to perform a relative movement along the peeling direction, the peeling is carried out while imparting a peeling force in zigzag directions along the surface of the sheet.

In the sheet peeling method, when carrying out the peeling, the peeling is preferably carried out while preventing floating of a folding edge of the peeling sheet.

According to the present invention, since a swing mechanism is provided so that the support means and the peeling head perform a zigzag movement when moving relatively each other, the peeling operation is carried out alternately within a plane with respect to the relative movement direction, whereby the peeling operation can be carried out with a small peeling width. Therefore, the peeling width is restricted from becoming extremely large; and owing to this, the peeling force is restrained to effectively prevent the peeling tape from slipping off or being broken, or the sheet itself stuck on the front surface from being torn off.

Also, by arranging the swing mechanism between the table and the base, such a structure is obtained that the swing mechanism is incorporated into the moving means. Therefore, by employing such arrangement, for example, that a motor capable of forward/reverse rotation is provided to the base, while the output shaft thereof is arranged in such a way as to be coupled with the table and so on, the swing mechanism can be easily structured.

Moreover, in a structure in which the peeling assisting means is provided, the sheet can be folded back in the peeling direction while preventing the adherend from being floated up thereby preventing the adherend from being damaged.

Also, owing to such an arrangement that the swing plate constituting the peeling assisting means can perform the zigzag movement, even when the sheet is peeled off alternately in zigzag directions, the swing plate follows the movement to prevent the adherend from being floated up more reliably.

Figure 1:
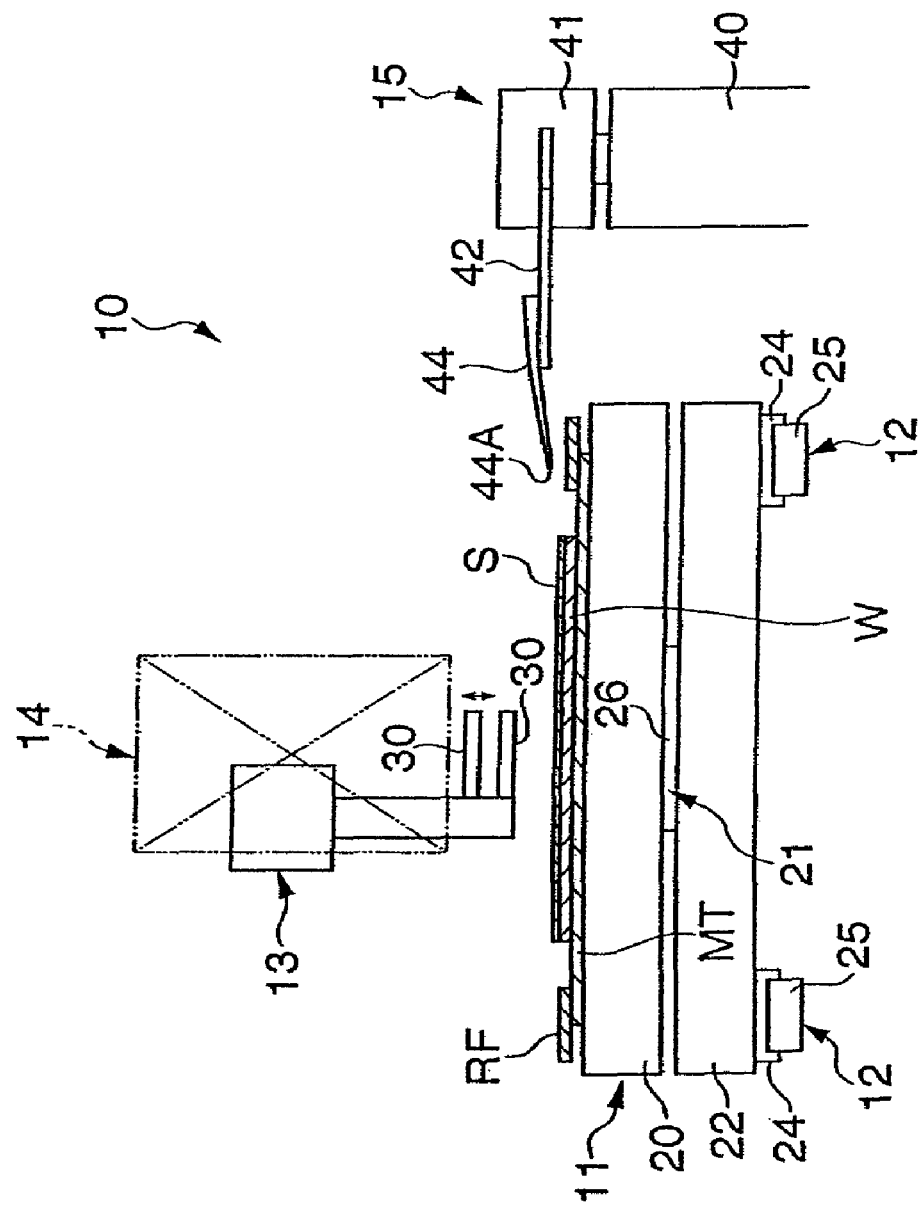
FIG. 1 is a schematic front view of a sheet peeling apparatus according to an embodiment of the present invention.

10: sheet peeling apparatus
11: support means
12: moving means
13: peeling head
15: peeling assisting means
20: table
21: swing mechanism
50: swing roller
50A: rolling member
T: peeling tape
RB: robot
S: sheet
W: wafer (plate-like member)

DETAILED DESCRIPTION OF THE PREFERRED EMBODIMENTS

Now, referring to the drawings, preferred embodiments of the present invention will be described below.

Figure 2:
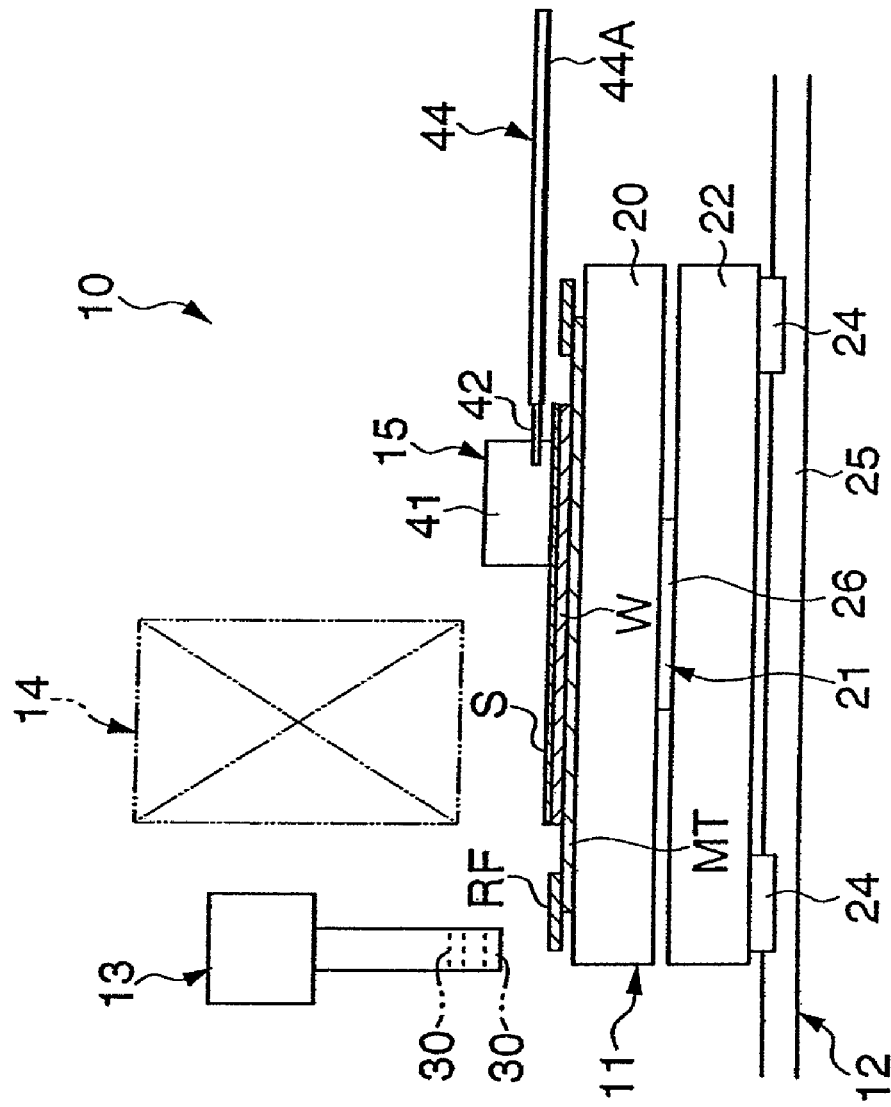
FIG. 2 is a schematic right-side view of the sheet peeling apparatus.

FIG. 1 shows a schematic front view of a sheet peeling apparatus according to an embodiment of the present invention, and FIG. 2 shows a schematic right-side view thereof. Referring to these figures, a sheet peeling apparatus 10 comprises a support means 11 that supports a wafer W as an adherend stuck with an adhesive sheet S (hereinafter, referred to as "sheet S") on a front surface (circuit surface) thereof at the upper surface side in the figures, a moving means 12 that supports the support means 11 in a movable manner, a peeling head 13 that sticks a peeling tape T (refer to FIG. 3) to a peripheral portion of the sheet S and peels off the sheet S from the wafer W, a tape supply unit 14 that has a function to feed out the peeling tape T at intervals of a predetermined length and to melt a part of the peeling tape T to bond the same to the sheet S by heat, and a peeling assisting means 15 arranged so as, when peeling off the sheet S, to be accessible to the sheet S.

Figure 3:
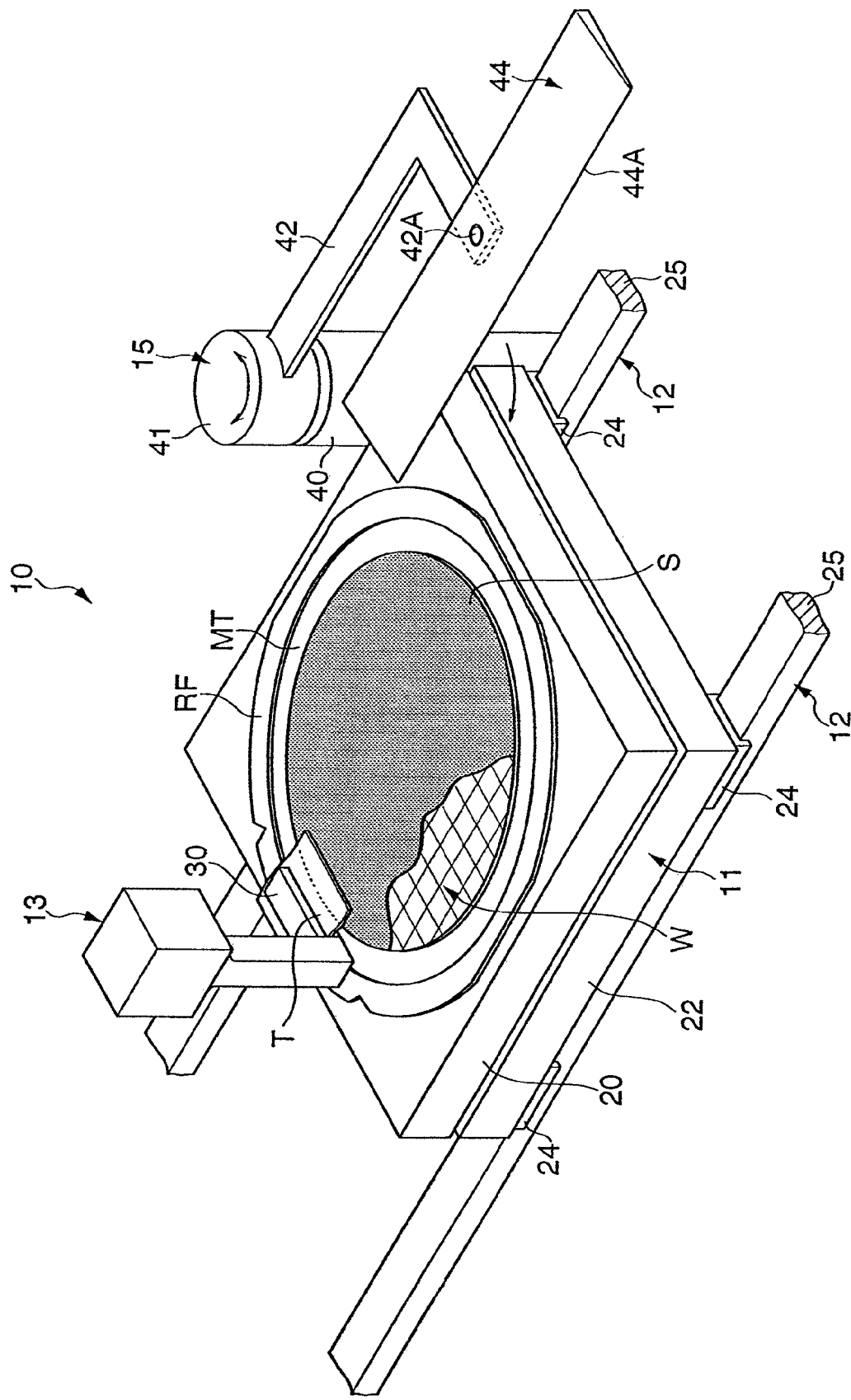
FIG. 3 is a schematic perspective view of the sheet peeling apparatus in which a tape supply unit is omitted.
Figure 4:
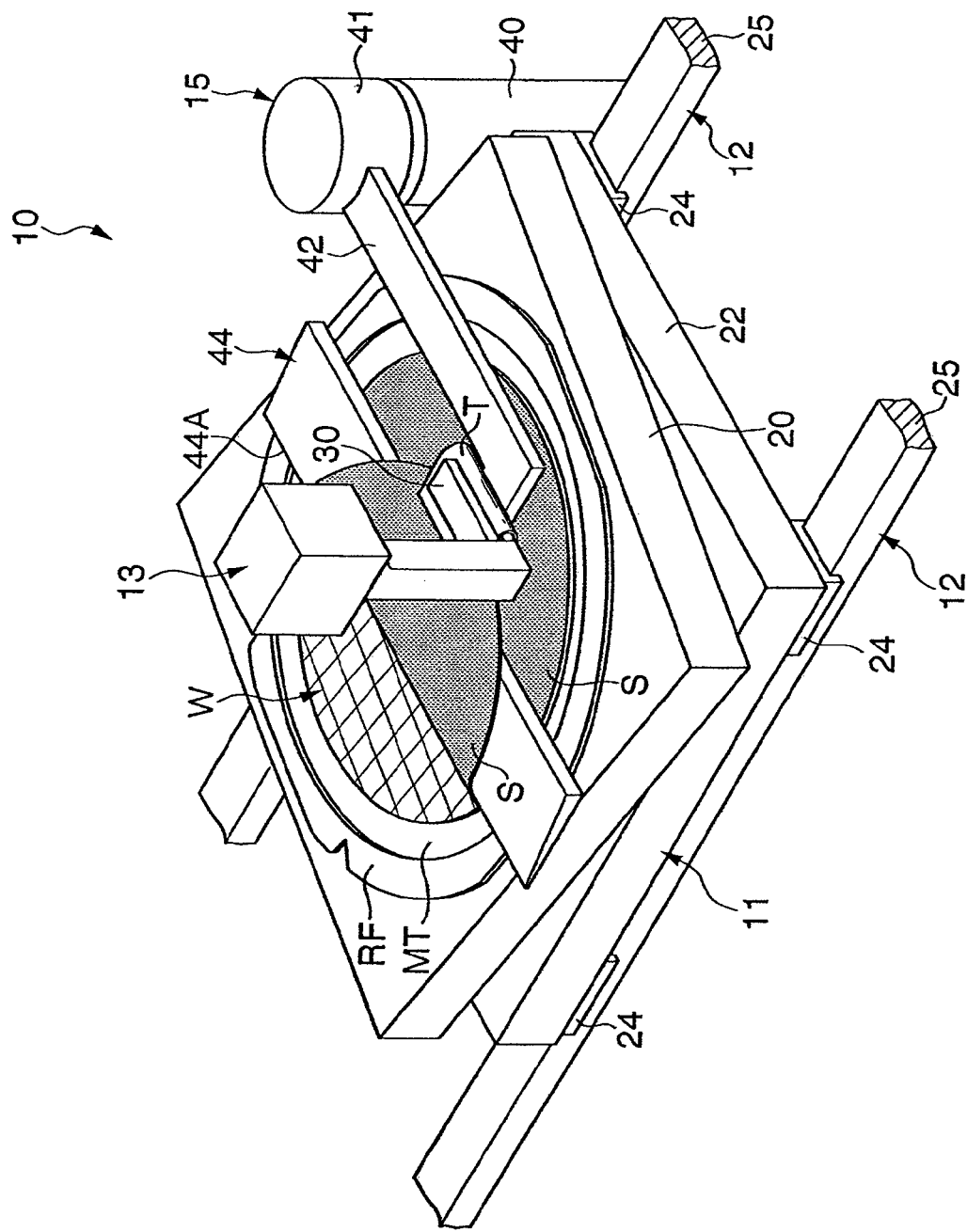
FIG. 4 is a schematic perspective view of the sheet peeling apparatus showing a state that a table has rotated a predetermined angle.

The support means 11 includes, as shown in FIG. 3 and FIG. 4, a table 20 having a substantially square shape in plan view and equipped with a loading plane at the upper surface side thereof for sucking and holding the wafer W and a ring frame RF via a mounting tape MT, and a base 22 having a substantially square shape for supporting the table 20 via a swing mechanism 21. At the bottom surface side of the base 22, sliders 24 are attached thereto in the vicinity of the respective corners. The sliders 24 are supported by a pair of guide rails 25; and thereby the support means 11 is provided to be movable along an extending direction of the guide rails 25. Here, the moving means 12 is composed of the sliders 24 and the guide rails 25.

The swing mechanism 21 in this embodiment, although not particularly limited, includes a motor (not shown) disposed within the base 22, capable of forward/reverse rotation, and an output shaft 26 of the motor (refer to FIG. 1). The front-end portion of the output shaft 26 is fixed to the bottom surface side of the table 20; and the table 20 is arranged so as, when the motor rotates a predetermined angle in forward and reverse directions alternately, to perform swing movements alternately within a plane with respect to the base 22 as shown in FIG. 4.

The peeling head 13 is supported at the tape supply unit 14 side via a support device (not shown). The peeling head 13 includes a pair of chuck claws 30 (upper and lower) in a lower portion thereof, which are arranged to move closer to/away from each other in a vertical direction so as to nip a lead end area of the peeling tape T supplied from the tape supply unit 14 between the chuck claws 30 to hold the peeling tape T.

The tape supply unit 14, which is substantially identical to a unit disclosed in Japanese Patent Application Laid-Open No. 2003-22986 filed by the applicant (assignee), is employed. To describe briefly, the tape supply unit 14 includes a tape feed-out section that feeds out the peeling tape T to the peeling head 13, a cutter that cuts off the peeling tape T at a predetermined length, and a heater that melts to bond the peeling tape T, which is cut off in a sheet-like shape, to the sheet S by heat. Since the tape supply unit 14 is not the main subject matter of the present application, detailed description of the component parts thereof is omitted here.

The peeling assisting means 15 includes a supporting column 40 disposed beside the support means 11, a turning member 41 provided in the upper portion of the supporting column 40 and arranged to be rotatable in a plane, a rotation arm 42 having a substantially L-like shape in a plan view, which is connected to a peripheral portion of the turning member 41, and a swing plate 44 attached to a front end portion of the rotation arm 42 in a swingable manner via a support shaft 42A (refer to FIG. 3). The peeling assisting member 15 is arranged so that the turning member 41 turns substantially 90° starting from the initial position of the swing plate 44, which is retired from an upper portion of the wafer W, to the operation position, which is the accessed position of the upper surface side of the sheet, in sheet peeling off process. The swing plate 44 has a substantially rectangular shape in plan view and is arranged so that, when accessing to the operation position to peel off the sheet S, an edge portion 44A thereof comes into contact with a folding edge of the sheet S and performs zigzag movements being pushed by a force that peels off the sheet S.

Now, referring to FIGS. 5 through 8, a sheet peeling method in this embodiment will be described.

First, the wafer W is placed on the table 20 along with the ring frame RF via a transfer arm or the like (not shown). Then, a predetermined length of the peeling tape T is supplied from the tape supply unit 14 between the chuck claws 30 of the peeling head 13, and a part of the peeling tape T is performed heat sealing to a peripheral portion of the sheet S by a heater (not shown) (refer to FIG. 3). It is noted that the supplying operation of the peeling tape T, the cutting operation to a predetermined length and heat sealing thereof are substantially identical to the operations set forth in the above-mentioned Japanese Patent Application Laid-Open No. 2003-22986.

Figure 5:
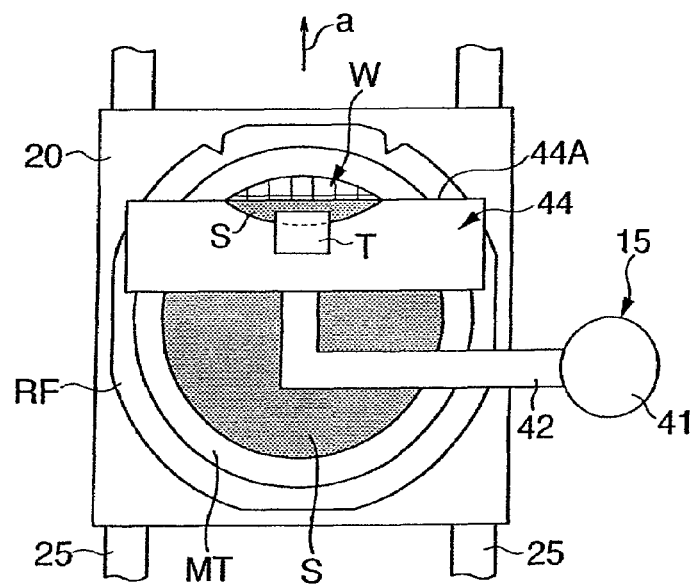
FIG. 5 is a schematic plan view illustrating an initial stage of sheet peeling operation.

Then, as shown in FIG. 5, the support means 11 starts moving via the moving means 12 in a direction of an arrow "a" in FIG. 5. At this time, in the peeling assisting means 15, the turning member 41 turns substantially 90° so that the swing plate 44 moves from the retired position to the position above the sheet S causing the edge portion 44A of the swing plate 44 to come into contact with the folding edge of the sheet S.

Figure 6:
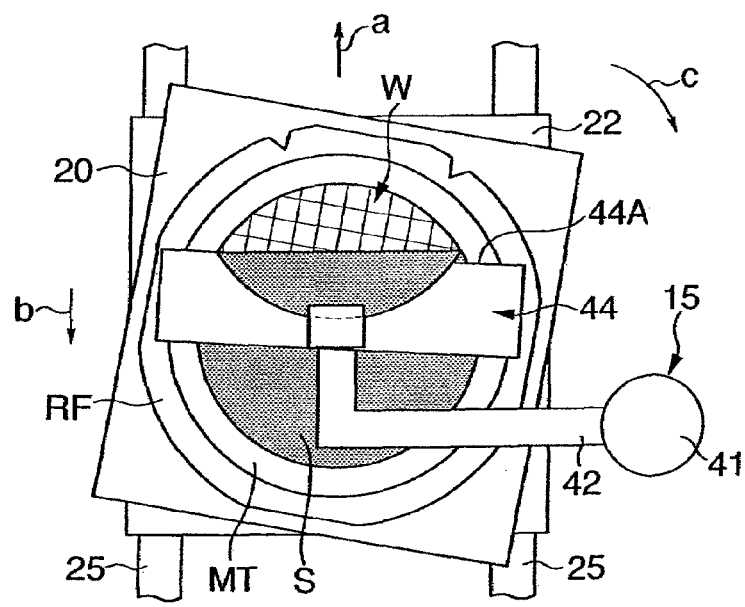
FIG. 6 is a schematic plan view of the table in the process of peeling operation showing a state that the table rotates in a clockwise direction.
Figure 7:
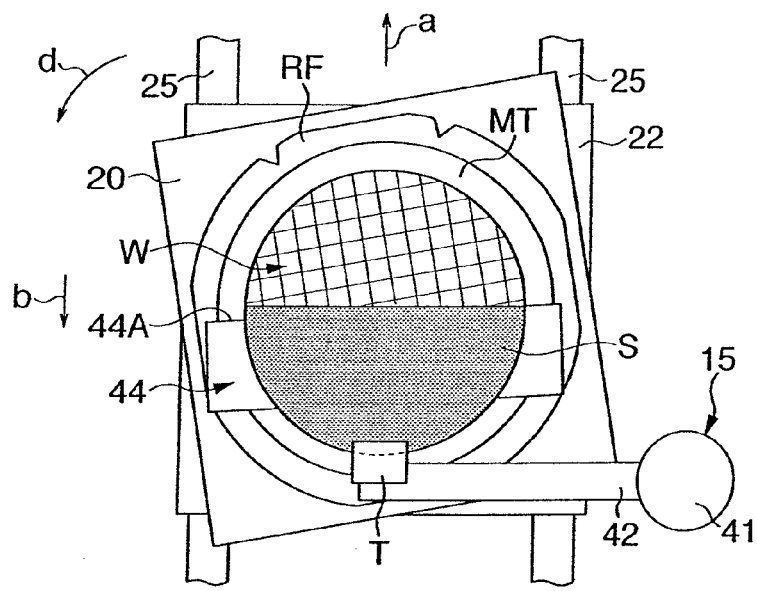
FIG. 7 is a schematic plan view of the table in the process of peeling operation showing a state that the table rotates in a counterclockwise direction.
Figure 8:
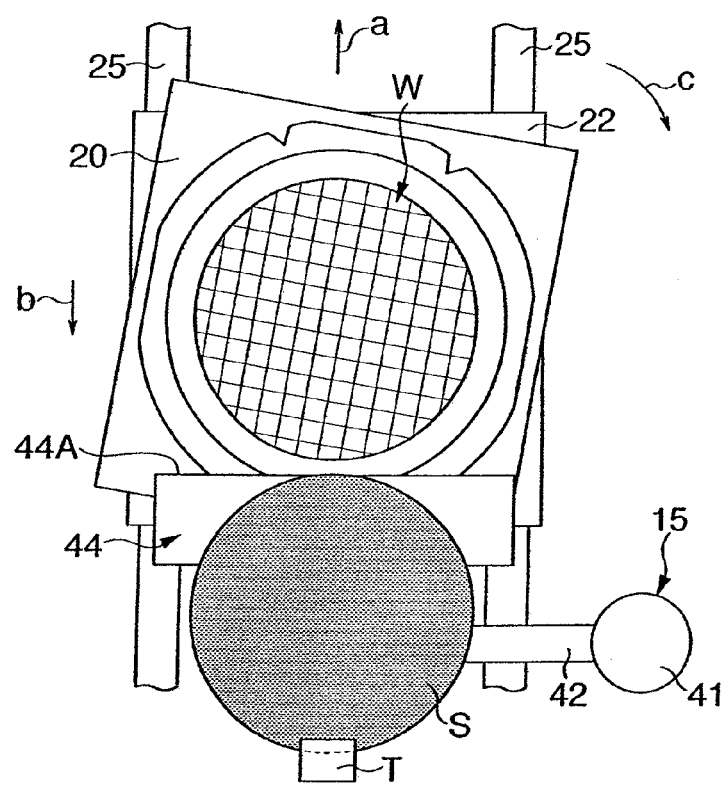
FIG. 8 is a schematic plan view illustrating a final stage of the peeling operation.

As shown in FIG. 6, the support means 11 moves in a direction of an arrow "a" in FIG. 6, and the peeling head 13 moves in a direction of an arrow "b" in FIG. 6 synchronous with the movement of the support means 11. At this time, the table 20 is rotated in a direction of an arrow "c" by the swing mechanism 21. Owing to this, the sheet S is turned up and gradually peeled off from the wafer W. When a detection means (not shown) detects that the support means 11 has reached a predetermined position, the support means 11 and the peeling head 13 continue the respective movements separating from each other, and the rotation of the table 20 changes its turning direction as an arrow "d" by the swing mechanism 21 as shown in FIG. 7. Thus, while the support means 11 and the peeling head 13 perform the separating movements, the table 20 repeats the rotational movement in the directions of the arrows "c" and "d" alternately whereby the sheet S is peeled off step by step in the zigzag directions to complete peeling (refer to FIG. 8). Accompanying this, a peeling force is imparted unevenly to the edge portion 44A of the swing plate 44 in a longitudinal direction thereof; and at this time, the swing movement is performed on the support shaft 42A as the rotation axis (angular changes within a plane). Therefore, the peeled sheet sticks partially again to the wafer W due to the angular changes, however, since no pressure is applied thereto, the sticking force is very small; and therefore the peeling resistance thereafter is not increased. It is preferred to employ an adhesive sheet of UV curable type as the sheet S because re-sticking does not occur.

After the sheet S has been completely peeled off from the wafer W by continuing the foregoing relative movement and zigzag movements, the wafer W is conveyed along with the ring frame RF via the transfer arm (not shown). On the other hand, the peeled sheet S is discarded along with the peeling tape T into a waste box or the like (not shown). When the table 20 and the peeling assisting means 15 have returned to the initial position, a new wafer W as the object to be peeled off is transferred onto the table 20, and the sheet S is peeled off likewise.

Consequently, according to the above-described embodiment, while the table 20 and the peeling head 13 perform a relative movement, the table 20 turns a predetermined angle in the clockwise and counterclockwise directions alternately via the swing mechanism 21 whereby the sheet S is peeled off in zigzag directions. Accordingly, the sheet S can be peeled off while preventing the peeling width from becoming too large and restricting the peeling resistance. Therefore, even when a fragile article like the wafer W is handled as the object, damage of the wafer W can be effectively prevented.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to shape, location, layout and the like without departing from the technical spirit and the range of the object of the present invention.

Figure 9:
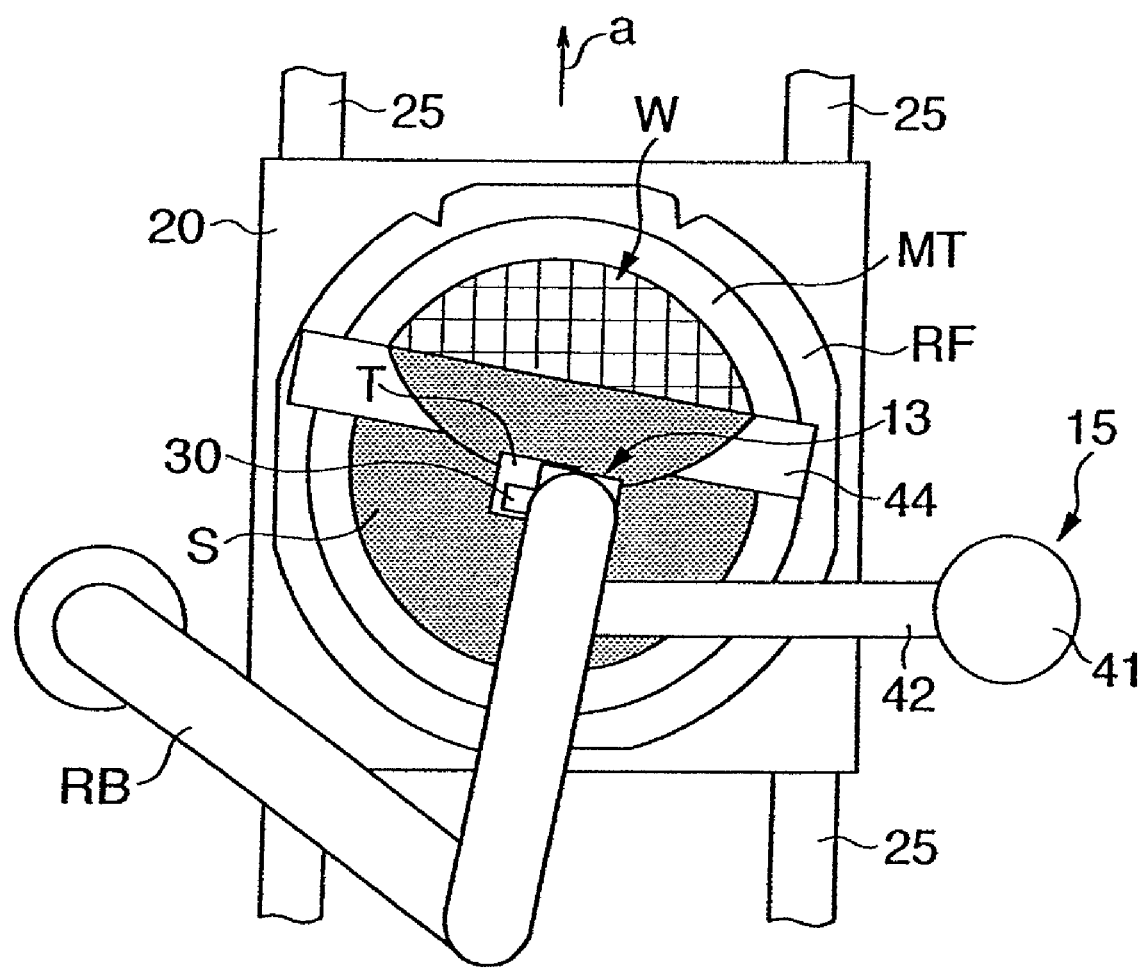
FIG. 9 is a schematic perspective view of a modification, which is similar to FIG. 4.

For example, the above-described embodiment is arranged in such a way that the swing mechanism 21 is provided in the table 20 side and the table 20 moves along the guide rails 25 thereby enabling the zigzag peeling. However, the present invention is not limited to such arrangement, but as shown in FIG. 9, may be arranged in such a way that the peeling head 13 is rotatably attached to an arm of the robot RB so as to move the peeling head 13. In this case, the peeling head 13 moves downward in an X-axis direction while performing swing movement accompanying a movement in a Y-axis direction with respect to the wafer W, and the table 20 moves upward in the X-axis direction.

Also, only the robot RB may be adapted to move while the table 20 is secured.

Further, in the above-described embodiment, so-called a heat sensitive adhesive tape, which is melted by heat to bond to the sheet S, has been described as an example of the peeling tape T. However, pressure sensitive adhesive tape may be employed as well.

Furthermore, in the above-described embodiment, there has been illustrated and described a case in which the peeling assisting means 15 is provided. However, the peeling assisting means 15 may be omitted. Basically, the present invention requires only that the sheet S be peeled off accompanying a zigzag movement.

Figure 10:
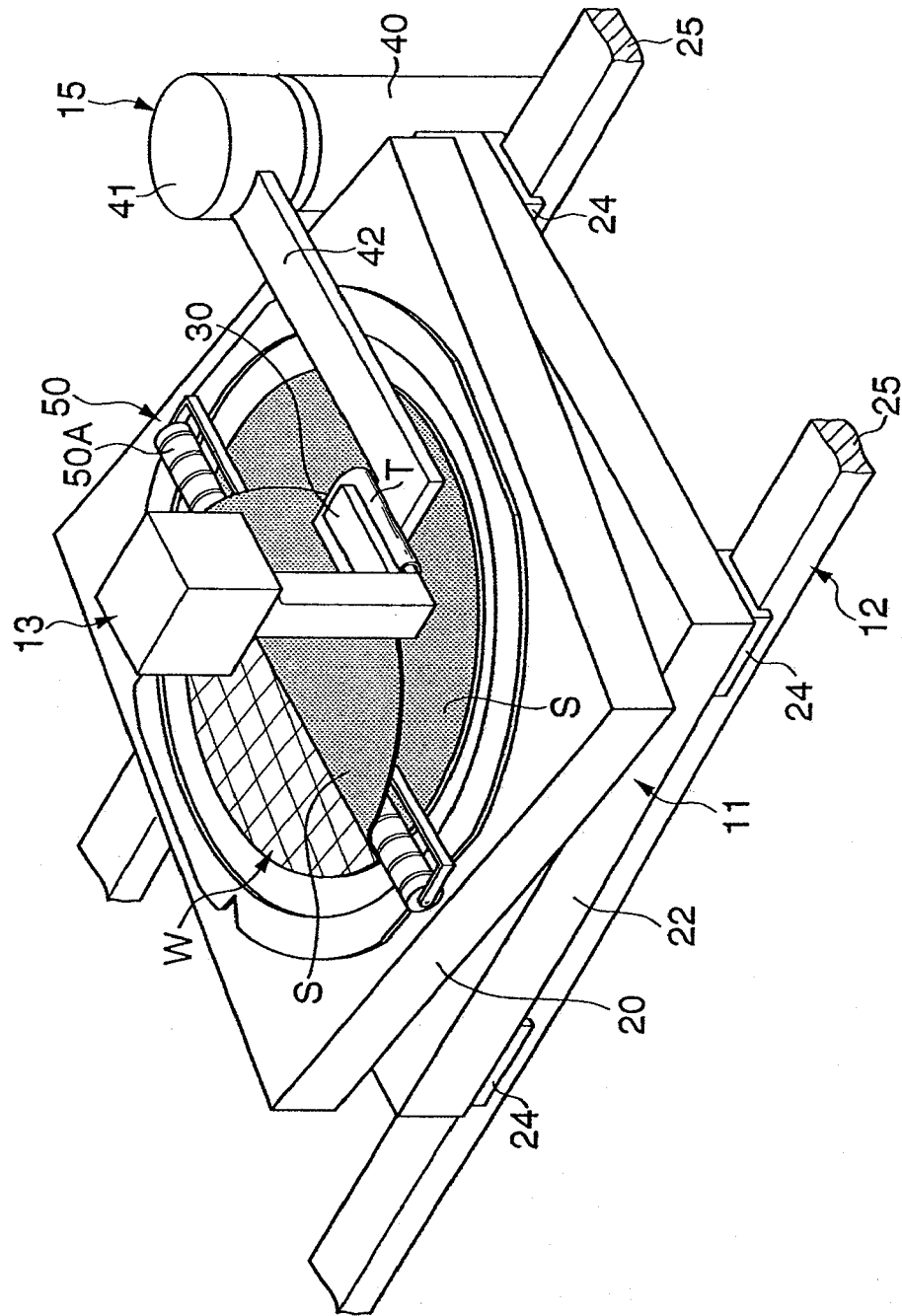
FIG. 10 is a schematic plan view of another modification in peeling operation, which employs a swing roller.

Still further, the swing plate 44 may be replaced with a swing roller 50 provided with a plurality of rolling members 50A as shown in FIG. 10.

What is claimed is:

1. A sheet peeling apparatus, comprising:
   a support means that supports an adherend stuck with a sheet on a surface thereof;
   a peeling head that sticks a peeling tape onto said sheet to peel off said sheet; and
   a moving means that causes said support means and peeling head to perform a relative movement thereby peeling off said sheet, wherein
   at least one of said support means and peeling head is provided with a swing mechanism, and when said support means and peeling head perform the relative movement, a zigzag movement accompanies therewith via said swing mechanism.

2. The sheet peeling apparatus according to claim 1, wherein:
   said support means includes a table having a loading plane for said adherend and a base for supporting the table;
   said swing mechanism is provided between said table and base; and
   said table is arranged so as to be capable of turning alternately with respect to the base within a plane via the swing mechanism.

3. The sheet peeling apparatus according to claim 1, wherein:
   said peeling head is attached to a free-end side of a multi-articulated robot having a plurality of joints; and
   the robot functions as said swing mechanism and is arranged so as to be capable of swinging alternately with respect to said support means within a plane.

4. The sheet peeling apparatus according to claim 1, further comprising a peeling assisting means accessible to the upper surface side of said sheet, wherein the peeling assisting means includes a swing plate having an edge that is, when peeling off said sheet, brought into contact with a folding edge of the sheet.

5. The sheet peeling apparatus according to claim 4, wherein said peeling assisting means is arranged to be swingable within a plane so as to follow said zigzag movement.

6. The sheet peeling apparatus according to claim 1, wherein said peeling assisting means includes a swing roller having a rolling member that, when peeling off said sheet, enters a folded portion of the sheet.

7. A sheet peeling method, comprising the steps of:

sticking a peeling tape via a peeling head to a peripheral area of a sheet stuck on a front surface of an adherend; and in a state that the peeling tape is held, peeling off the sheet toward a side opposite to a position where the peeling tape is stuck thereto, wherein when said adherend and peeling head are caused to perform a relative movement along said peeling direction, the peeling is carried out while imparting a peeling force in zigzag directions along the surface of the sheet.

8. The sheet peeling method according to claim 7, wherein, when carrying out the peeling, the peeling is carried out while preventing floating of a folding edge of said peeling sheet.

* * * * *